United States Patent
Wallace et al.

(10) Patent No.: US 9,350,344 B2
(45) Date of Patent: May 24, 2016

(54) TEST PATTERN MEMBRANE AND METHOD FOR TESTING CAPACITIVE SENSORS

(71) Applicant: Pure Imagination, LLC, Vancouver, WA (US)

(72) Inventors: Michael Wallace, Vancouver, WA (US); Philip T. Odom, Portland, OR (US); Brian Richardson, Portland, OR (US); Jim Eastman, San Francisco, CA (US)

(73) Assignee: Pure Imagination, LLC, Vancouver, WA (US)

( * ) Notice: Subject to any disclaimer, the term of this patent is extended or adjusted under 35 U.S.C. 154(b) by 243 days.

(21) Appl. No.: 14/217,100

(22) Filed: Mar. 17, 2014

(65) Prior Publication Data

US 2014/0266247 A1    Sep. 18, 2014

Related U.S. Application Data

(60) Provisional application No. 61/800,530, filed on Mar. 15, 2013.

(51) Int. Cl.
*G01R 35/00* (2006.01)
*G01R 27/26* (2006.01)
*H03K 17/96* (2006.01)

(52) U.S. Cl.
CPC ............. *H03K 17/9622* (2013.01); *H03K 2217/960705* (2013.01)

(58) Field of Classification Search
CPC .... G01R 35/00; G01R 27/26; G01R 27/2605; H03K 17/9622; H03K 2217/960705
See application file for complete search history.

(56) References Cited

U.S. PATENT DOCUMENTS

2012/0212241 A1\* 8/2012 Wallace .............. A63F 3/00643
324/686

\* cited by examiner

*Primary Examiner* — Patrick Assouad
*Assistant Examiner* — Haidong Zhang
(74) *Attorney, Agent, or Firm* — Rylander & Associates, PC; Philip R. M. Hunt (57) ABSTRACT

A test pattern membrane test method uses a test pattern membrane to test the capacitive sensors of a device. The device is placed in the test fixture. The capacitive sensors are read without the test pattern membrane, storing as a set of baseline measurements. The test pattern membrane is placed on the unit to be tested. The test pattern membrane has a plurality of conductive areas on a non-conductive substrate. The conductive areas are arranged in a pattern that corresponds to the pattern of capacitive sensors. The sensors are read again to obtain a set of stimulated measurements. Differences for each of the sensors are determined between the sensor readings with and without the test pattern membrane in place. This difference is compared to a threshold. A sensor is considered to be functioning properly if the difference value is greater than the sensor's threshold value.

1 Claim, 9 Drawing Sheets

TEST PATTERN MEMBRANE AND METHOD FOR TESTING CAPACITIVE SENSORS

CROSS-REFERENCE TO RELATED APPLICATION

The present application claims priority to U.S. Provisional Application No. 61/800,530 filed on 15 Mar. 2013, incorporated herein by reference.

FIELD OF THE INVENTION

The present invention relates to testing of sensors. More particularly, the present invention relates to testing of capacitive touch and object sensors.

BACKGROUND

Devices with capacitive sensors need to be tested as part of the manufacturing process. There are various ways to do this, which depend on the type of system being tested. This invention is focused on testing of systems or assemblies having discrete capacitive touch and object detection sensors.

Existing test solutions have a number of problems. They can be slow, expensive, and complicated. Some testing methods require an operator to touch every sensor as part of the test procedure. This is slow and error prone, since it relies on an operator to touch the sensors with a consistent force and contact area. Other tests use a robotic system with a test "finger" that touches each point as part of the test. This system is more consistent and somewhat faster than tests that rely on an operator, but it is complex and expensive; it is also still relatively slow since it requires that the test finger touch each conductive area in sequence.

What is needed is a way to test a capacitive sensor assembly quickly and inexpensively.

SUMMARY

A test pattern membrane test method uses a test pattern membrane to test the capacitive sensors of a device. The device is placed in the test fixture. The capacitive sensors are read without the test pattern membrane, storing as a set of baseline measurements. The test pattern membrane is placed on the unit to be tested. The test pattern membrane has a plurality of conductive areas on a non-conductive substrate. The conductive areas are arranged in a pattern that corresponds to the pattern of capacitive sensors. The sensors are read again to obtain a set of stimulated measurements. Differences for each of the sensors are determined between the sensor readings with and without the test pattern membrane in place. This difference is compared to a threshold. A sensor is considered to be functioning properly if the difference value is greater than the sensor's threshold value.

The test pattern membrane testing method can detect broken connections to sensors and other sensor assembly defects that result in reduced sensitivity, such as adhesive thickness variations or air bubbles in a label on top of the sensors.

The test pattern membrane testing method can be used to test capacitive sensors that are intended for touch sensing or for object detection. The conductive areas on the test pattern membrane are designed differently for activating touch sensors than for activating object detection sensors. The test pattern membrane testing method can also test other types of touch sensors such as sliders or matrices by activating the individual elements of the larger sensor.

The test pattern membrane testing method is very fast compared to an operator manually testing each sensor in a system. In the exemplary embodiment, all sensors in a device-under-test are tested simultaneously instead of serially. In other embodiments, some of the sensors of the device-under-test are not tested simultaneously, but are tested in groups in which all sensors in the group are tested simultaneously and the groups are tested sequentially.

In testing a device-under-test with only touch sensors, manual testing could require an operator to touch each sensor in series in a particular order. Products that combine both touch and object detection sensors are more complicated and might require the operator to both touch all touch sensors and place an object on each object sensor. Since the test is fast, it also saves money by reducing the time required for testing.

The test pattern membrane test uses a test fixture to align the test pattern membrane with the device under test and to apply consistent pressure to the test pattern membrane at each sensor location. These factors make the test more repeatable than a manual test by an operator.

The test pattern membrane is passive. It does not require any external connections or power. Since the test pattern membrane is passive, it can be fabricated very inexpensively in a variety of different designs. It requires no external electronics, and it can be mounted in an inexpensive test fixture for use in production environments.

BRIEF DESCRIPTION OF THE DRAWINGS

The present invention will be described by way of exemplary embodiments, but not limitations, illustrated in the accompanying drawings in which like references denote similar elements, and in which:

The accompanying drawings, which are incorporated into and constitute a part of this specification, illustrate one or more embodiments of the invention and, together with the detailed description, serve to explain the principles and implementations of the invention.

FIG. 4b shows a basic touch sensor system circuit model that models the basic touch sensor system of FIG. 4a.

FIG. 6b shows a first object sensor system circuit model that models the first object sensor system of FIG. 6a.

FIG. 7b shows a second object sensor assembly circuit model that models the second object detection sensor of FIG. 7a.

FIG. 8b shows a third object sensor assembly circuit model that models the third object detection sensor of FIG. 8a.

DETAILED DESCRIPTION

Before beginning a detailed description of the subject invention, mention of the following is in order. When appropriate, like reference materials and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Use of directional terms such as "upper," "lower," "above," "below", "in front of," "behind," etc. are intended to describe the positions and/or orientations of various components of the invention relative to one another as shown in the various Figures and are not intended to impose limitations on any position and/or orientation of any embodiment of the invention relative to any reference point external to the reference.

Those skilled in the art will recognize that numerous modifications and changes may be made to the exemplary embodiment(s) without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the exemplary embodiment(s) is essential. Other embodiments are possible, their specific designs depending upon the particular application. As such, the scope of the invention should not be limited by the particular embodiments herein described but should be defined only by the appended claims and equivalents thereof.

Capacitive Sensors

Capacitive sensor assemblies suited to the test pattern membrane testing method disclosed herein are of the self-capacitance type. A self-capacitance sensor detects a touch or object by measuring changes in capacitance between the sensor and system ground. Capacitance of the capacitive sensor can be measured by known methods, such as timing how long it takes to charge or discharge, as taught in US Pat. Pub. 2009/0315258. A capacitive sensor is typically constructed as a conductive pad connected to the measurement system and covered by an electrically insulating layer.

Figure 4A:
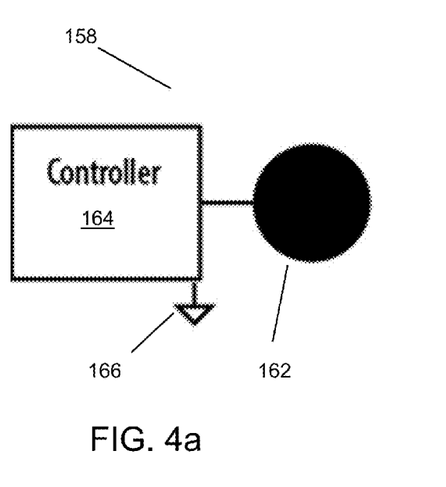
FIG. 4a shows a basic touch sensor.
Figure 4B:
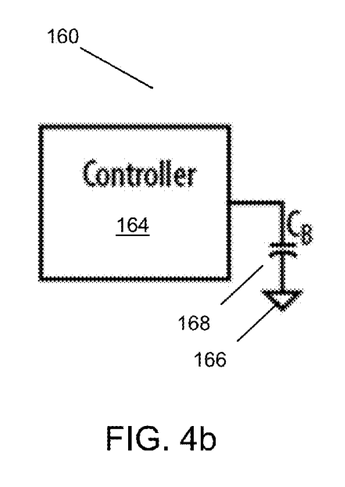

FIG. 4a shows a basic touch sensor system 158 comprising a sensor pad 162 electrically connected to a controller 164. FIG. 4b shows a basic touch sensor system circuit model 160 that models the basic touch sensor system 158. The sensor pad 162 and its connection to the controller 164 form one of the plates of a capacitor. There is a base level capacitance 168, CB, between the sensor pad 162 and ground 166 due to the construction of the basic touch sensor system 158 and the electronic components used. The controller 164 measures the capacitance of the sensor pad 162 by timing how long it takes to charge or discharge.

Figure 5A:
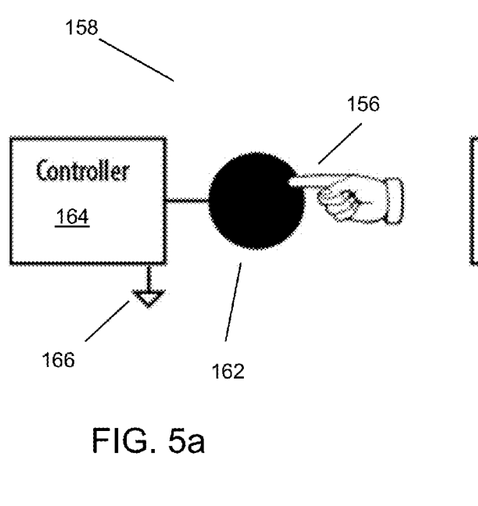
FIG. 5a shows a basic touch sensor system of FIG. 4a touched by a person 160.
Figure 5B:
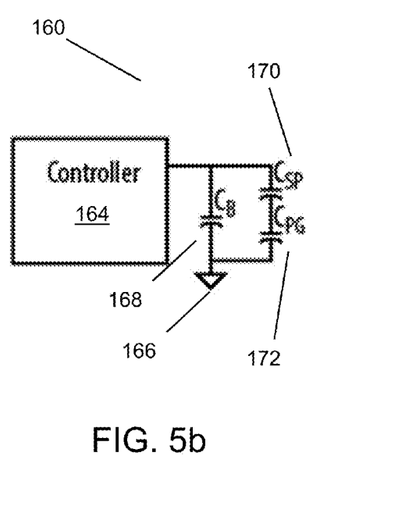
FIG. 5b shows changes that occur to the basic touch sensor system circuit model of FIG. 4b when touched by a person.

FIG. 5a shows a basic touch sensor system 158 of FIG. 4a touched by a person 156. FIG. 5b shows changes that occur to the basic touch sensor system circuit model 160 of FIG. 4b when touched by a person. When a person 156 touches the sensor pad 162, the capacitance between the person's finger 156 and the sensor pad 162 increases. A human body is relatively large, so there is a significant capacitance, a person-to-ground capacitance 172, $C_{PG}$, between it and ground 166 as well. Touching the sensor pad 162 introduces a sensor-to-person capacitance 170, $C_{SP}$, a parallel capacitance to ground for the sensor pad 162, in series with the person-to-ground capacitance 172, $C_{PG}$.

It is also possible to detect different types of objects using capacitive sensors. In particular, capacitive sensors can detect small conductive objects if a source of ground coupling to the object is provided. Small objects lack the large surface area of the human body, so they need to be brought into close contact with the system ground as well as to the sensor to provide enough additional capacitance for detection.

Figure 6A:
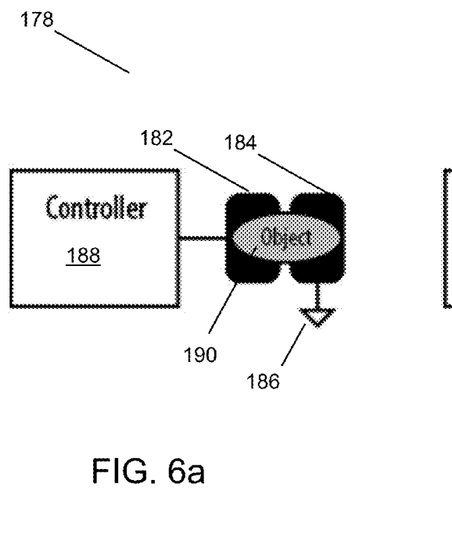
FIG. 6a shows a first object sensor system.
Figure 6B:
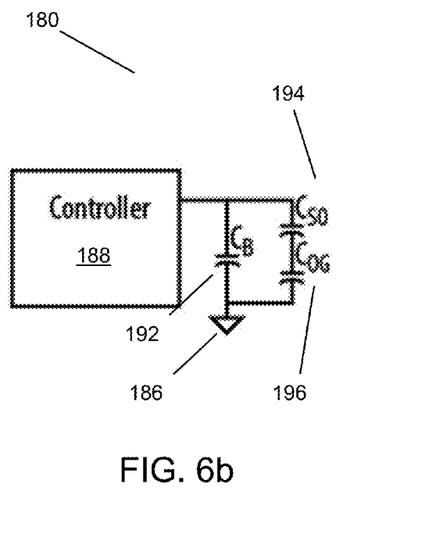

FIG. 6a shows a first object sensor system 178 comprising an object sensor pad 182 electrically connected to a controller 188 and a ground pad 184 electrically connected to ground 186. FIG. 6b shows a first object sensor system circuit model 180 that models the first object sensor system 178.

The ground pad 184 provides the necessary ground coupling. When a conductive object 190 is placed over the two pads 182, 184, a sensor-to-object capacitance 194 between the object and the sensor, $C_{SO}$, is introduced in series with an object-to-ground capacitance 196 between the object and ground, $C_{OG}$. This increases the total sensor-to-ground capacitance, which is registered by the first object sensor system 178.

A flexible object detection sensor takes advantage of idle sensor pads to provide the ground coupling for object detection. In a system that measures sensors' capacitance levels in sequence, the sensors that are not being actively measured can be connected to ground. This also helps to reduce noise and cross-talk between sensors.

Figure 7A:
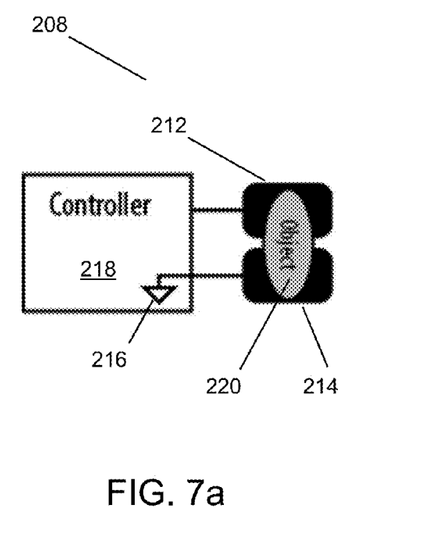
FIG. 7a shows a second object detection sensor.
Figure 7B:
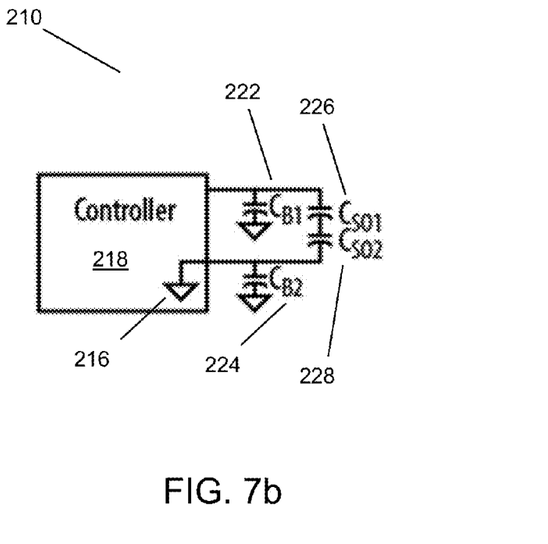

FIG. 7a shows a second object detection sensor 208 comprising a first sensor pad 212 electrically connected to a controller 218 and a second sensor pad 214, also electrically connected to the controller 218. FIG. 7b shows a second object sensor assembly circuit model 210 that models the second object detection sensor 208. The first sensor pad 212 has a first base level capacitance 222 and the second sensor pad 214 has a second base level capacitance 224. The controller 218 is configured to idle one sensor pad by coupling it to ground 216. For example, in FIG. 7a, the second sensor pad 214 is idled and connected to ground 216. The idled sensor pad provides the ground coupling required for object detection, but in other configurations, the sensor pads, 212, 214 can be used independently as touch sensors. If a conductive object 220 is placed covering two sensor pads 212, 214, the first sensor pad 212 experiences a change in capacitance as a first sensor-to-object capacitance 226, $C_{SO1}$, in series with a second sensor-to-object capacitance 228, $C_{SO2}$, is added in parallel to the first base level capacitance 222 and the second base level capacitance 224 is added in parallel to the first base level capacitance 222 as well. The controller 218 detects this change in capacitance on the first sensor pad 212, registering that a conductive object 220 is present on the sensor pads 212, 214.

Figure 8A:
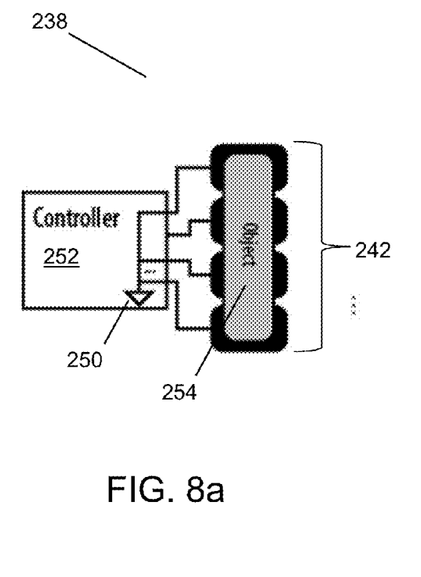
FIG. 8a shows a third object detection sensor comprising multiple sensor pads electrically connected to a controller.
Figure 8B:
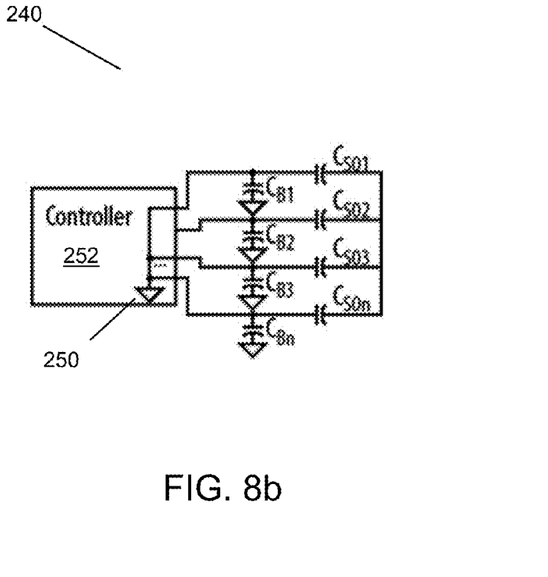

Likewise, if an object is placed that covers multiple sensors, the idle sensors will all provide additional ground coupling when a sensor in the ground is sampled, resulting in a larger change than if the object only covered two sensor pads. FIG. 8a shows a third object detection sensor 238 comprising multiple sensor pads 242 electrically connected to a controller 252. FIG. 8b shows a third object sensor assembly circuit model 240 that models third object detection sensor 238. The controller 252 connects to ground 250 all but one of the multiple sensor pads 242 and measures the capacitance of the one ungrounded sensor pad 242.

Exemplary Embodiment of a Test Pattern Membrane

Figure 1:
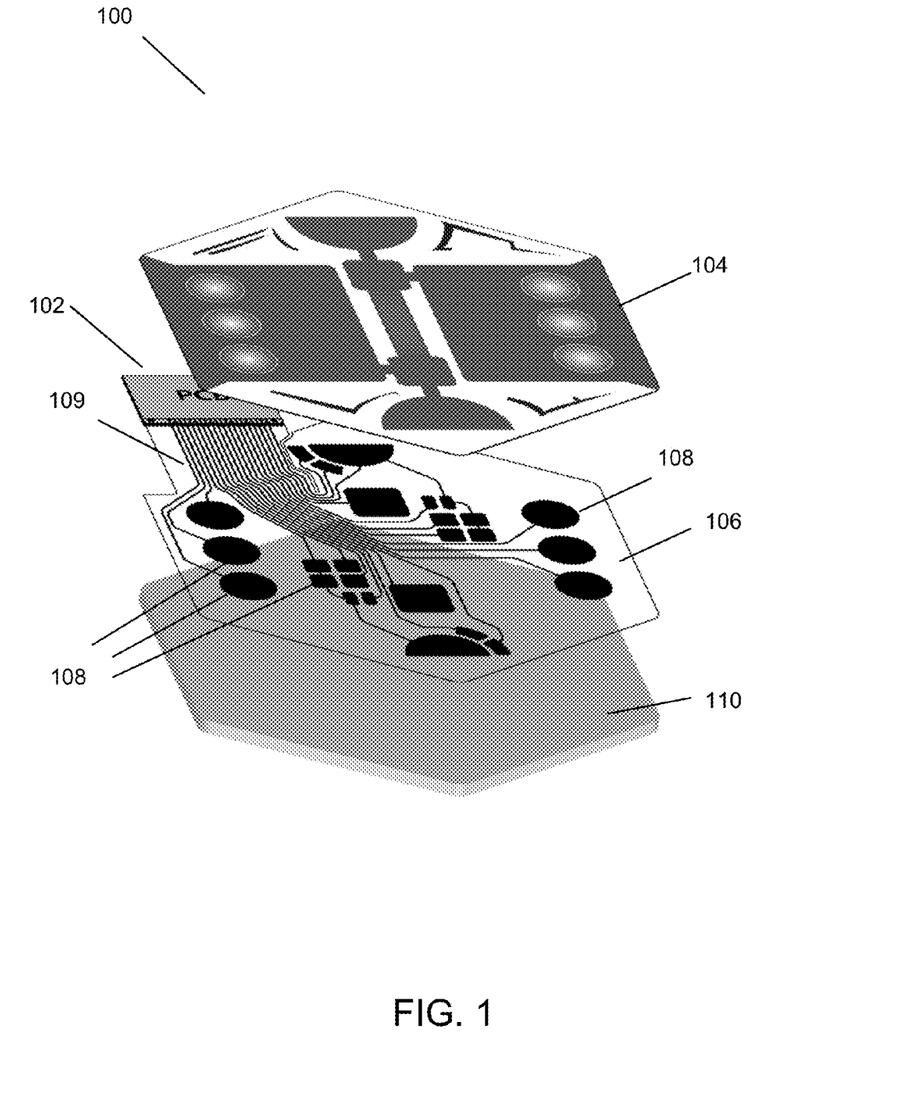
FIG. 1 shows an exploded view of a device-under-test with a capacitive sensor assembly.

FIG. 1 shows an exploded view of a device-under-test 100 with a capacitive sensor assembly 106. The device-under-test 100 includes a plastic housing 108, a capacitive sensor assembly 106 connected to a printed circuit board 102 with sensor conductive traces 109, and a label 104 that covers the capacitive sensor assembly 106. The label 104 includes graphics and a protective insulating layer.

Figure 2:
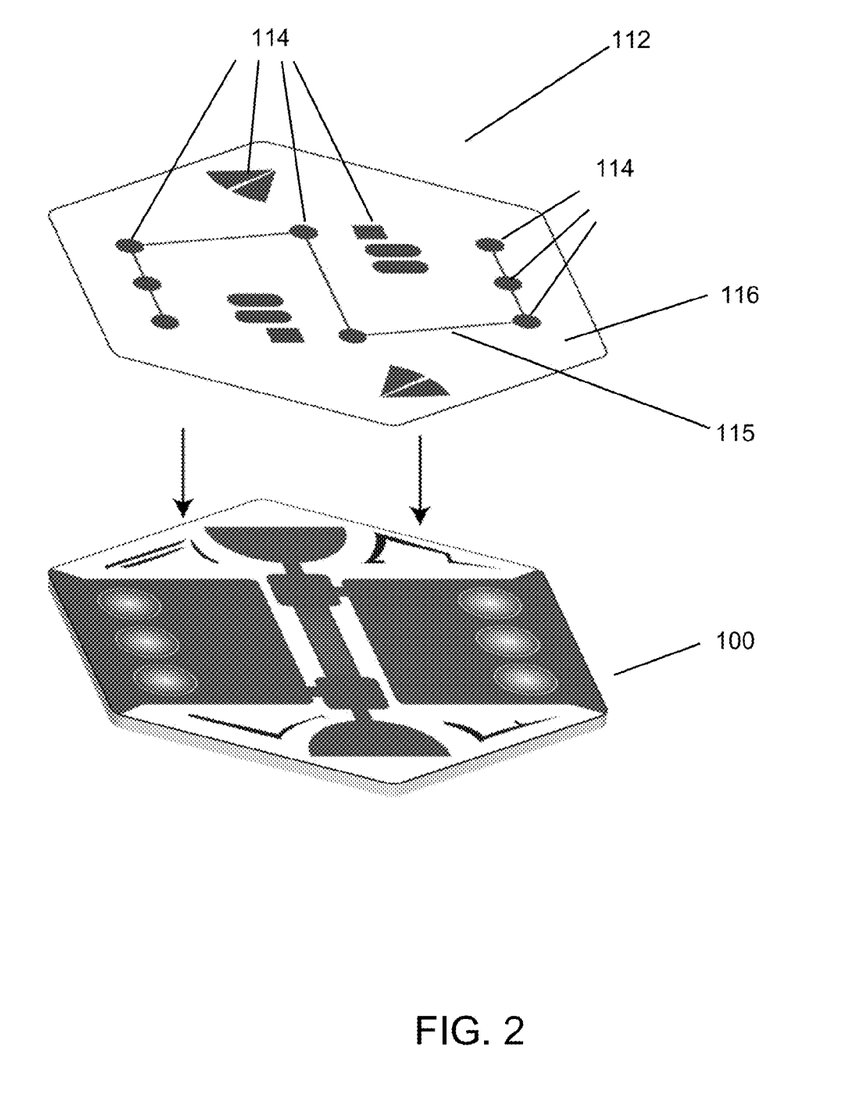
FIG. 2 shows a perspective view of a test pattern membrane configured for testing the device-under-test in FIG. 1.

FIG. 2 shows a perspective view of a test pattern membrane 112 that can be used for testing products that have capacitive sensors, such as the device-under-test 100 in FIG. 1. The test pattern membrane 112 is a passive assembly that comprises one or more conductive areas 114 (i.e., conductive areas) patterned on a substrate 116 that is non-conductive. The substrate 116 may be flexible or rigid. The locations of these conductive areas 114 correspond to the locations of the capacitive sensors 108 on the device-under-test 100. The conductive areas 114 on the test pattern membrane 112 line up with the capacitive sensors 108 and stimulate the sensors 108 when the test pattern membrane 112 is placed in alignment with and in contact with the device-under-test 100 (as shown in FIG. 2). In the exemplary embodiment, all sensors 108 of the device-under-test 100 are tested simultaneously, but in other embodiments, some of the sensors of the device-under-test 100 are not tested simultaneously.

Figure 9:
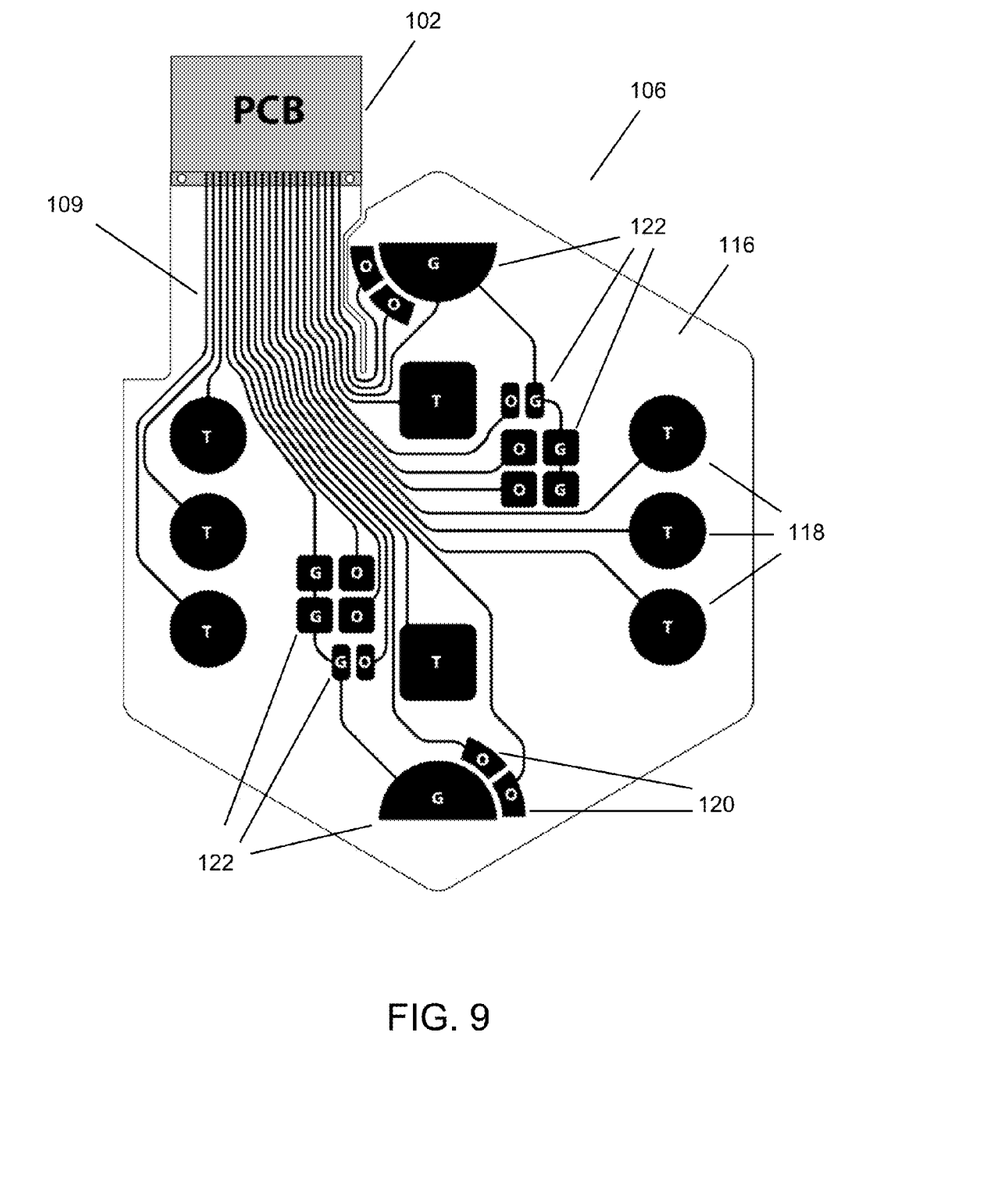
FIG. 9 shows a capacitive sensor assembly.
Figure 10:
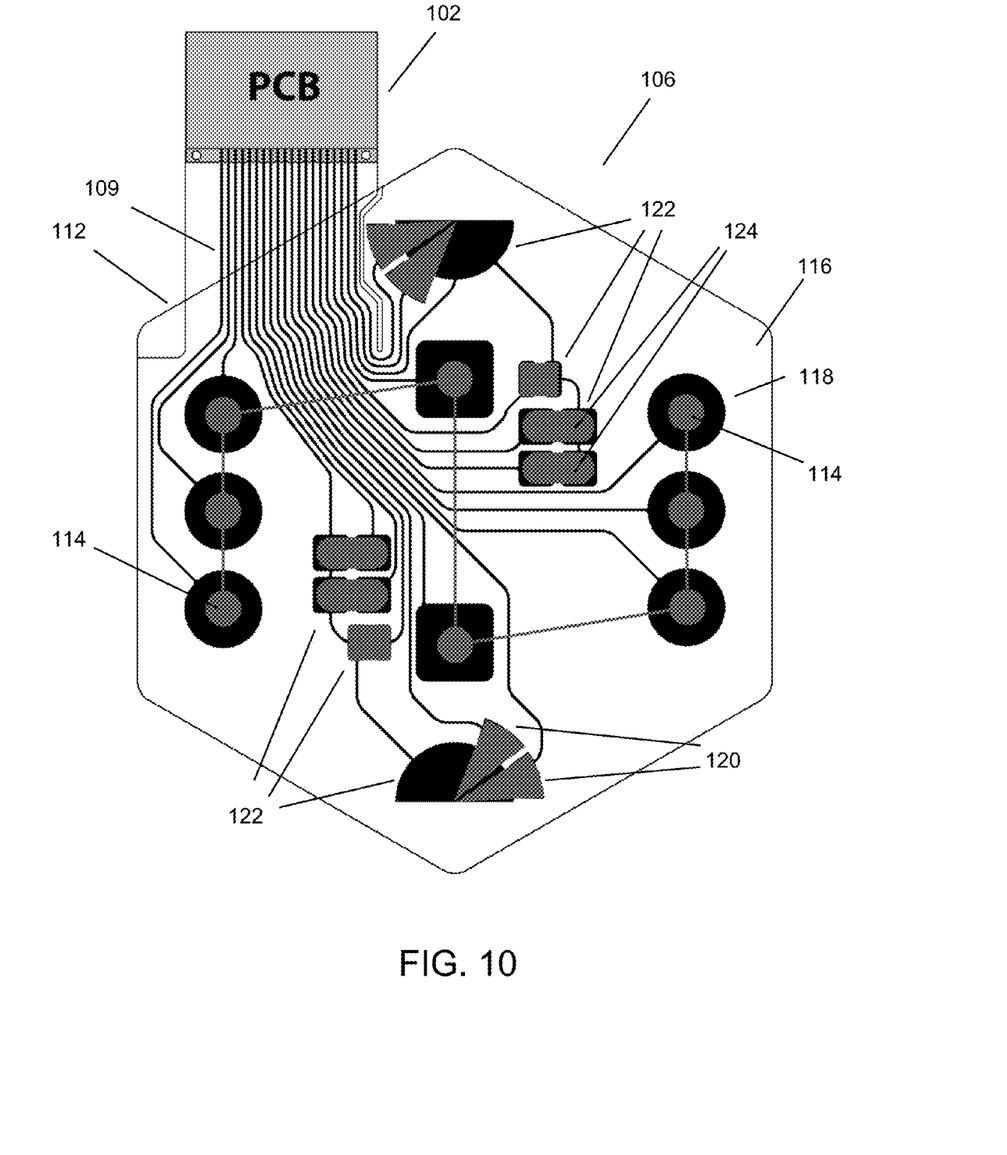
FIG. 10 shows the capacitive sensor assembly of FIG. 9 with a test pattern membrane overlain.
Figure 11:
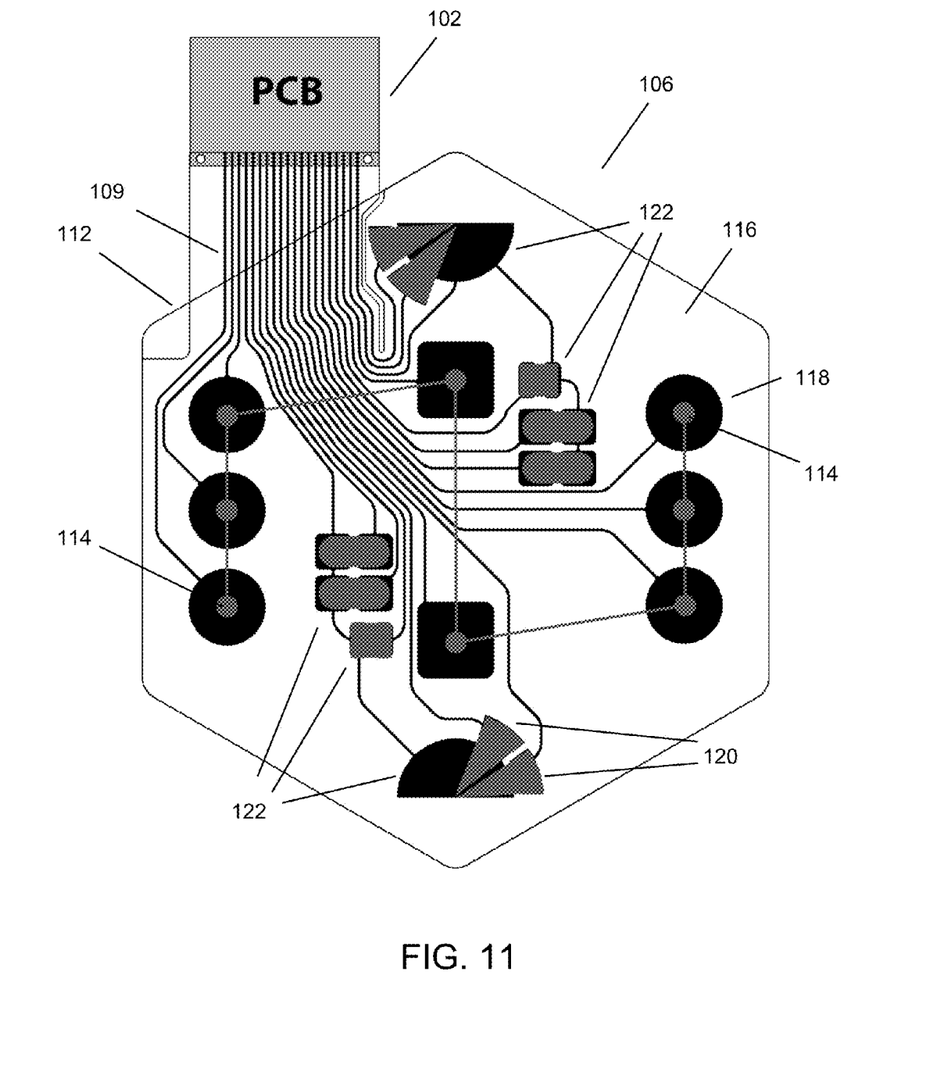
FIG. 11 shows the same test pattern membrane with smaller conductive areas over the touch sensor pads.

FIGS. 9-11 give a more detailed example of these concepts. FIG. 9 shows a capacitive sensor assembly 106 with touch sensor pads 118, object sensor pads 120, and ground pads 122, all connected by sensor conductive traces 109 to the printed circuit board 102 and/or to other pads.

FIG. 10 shows the capacitive sensor assembly 106 of FIG. 9 with a test pattern membrane 112 overlain. The test pattern membrane 112 for this capacitive sensor assembly 106 includes individual multi-pad conductive areas 124 for testing the object sensors and a network of conductive areas 114 for testing the touch sensor pads 118.

Smaller touch sensor conductive areas can be used to test for proper response to smaller capacitance changes. FIG. 11 shows the same test pattern membrane 112 with smaller conductive areas 114 over the touch sensor pads 118.

In the exemplary embodiment, the test pattern membrane 112 is fabricated from Mylar printed with conductive silver ink, but the basic test pattern membrane 112 concept can be extended to other types of construction. In theory, other test fixtures that simultaneously activates all sensors would work similarly. This would include the following:
- Other types of conductive ink (copper, nickel, silver, etc.) printed on various substrates (Kapton, Mylar, etc.).
- Chemically etched metal (such as copper) on rigid or flexible substrates.
- Stamped metal conductive areas glued to a substrate.
- Independent metal conductive areas mounted to a test fixture frame.
- Assemblies with metal conductive areas might have the conductive areas connected with wire for testing touch sensors.

In some cases, testing using a solid piece of conductive material, such as sheet metal or foil, may be a suitable alternative to a patterned test pattern membrane 112. This approach activates all sensors in a less controlled fashion, but may be adequate in some cases to test functionality. This solid piece of conductive material would also be very durable and less prone to failure than a test pattern membrane 112. Hybrid approaches are also possible. For example, a solid sheet of material can be used that includes cutouts to avoid connecting sensor conductive traces 109.

Testing Capacitive Sensors

The test pattern membrane testing method described herein uses grounded idle capacitive sensors 108 in the device-under-test 100 to provide the ground coupling necessary to test other capacitive sensor 108 in the device-under-test 100.

The test pattern membrane 112 includes one or more conductive areas 114 (or "spots") at locations on the test pattern membrane 112 corresponding to locations of touch sensor pads 118 on the capacitive sensor assembly 106 of the device-under-test 100. In the exemplary embodiment, all of these conductive areas 114 are connected to each other with membrane conductive traces 115. Together, the connected conductive areas 114 act as one large conductive object that simultaneously covers all touch sensors. Capacitive coupling between the conductive areas 114 at idle locations and the grounded idle touch sensor pads 118 provides the ground coupling for the active touch sensor pads 118 to detect the test pattern membrane 112. However, in other embodiments, some of the conductive areas 114 corresponding to touch sensor locations are not connected.

The area of the conductive areas 114 on the test pattern membrane 112 may be varied when making the test pattern membrane 112 to provide a desired level of sensor response. The desired response varies depending on the capacitive sensor assembly 106 of the device-under-test 100 and the performance desired from it. Some capacitive sensor assemblies 106 may be set up to be very sensitive, and it will be desirable to use smaller test pattern membrane 112 conductive areas to verify that the touch sensors are adequately responsive. For example the conductive areas 114 in FIG. 11 are smaller than the conductive areas 114 in FIG. 10.

The capacitance between a conductive area 114 and a touch sensor pad 118 is roughly linear with respect to contact area. Assuming that the conductive area 114 is smaller than the touch sensor pad 118, the contact area will be determined by the size of the test pattern membrane 112 conductive area.

Since the number of touch sensor pads 118 in a capacitive sensor assembly 106 varies, the size of the conductive areas 114 at the touch sensor locations must vary with the number of touch sensor pads 118 to provide a desired level of capacitance. Assuming that the capacitance between each conductive area and its sensor is a constant value C, a test pattern membrane 112 with n connected conductive areas 114 increases the capacitance of the active sensor by C in series with (n−1)×C.

This total capacitance is $$C_{tot} = \frac{n-1}{n}C.$$

For assemblies with many sensors (>10), this value is roughly C, and the conductive area size is nearly constant. For smaller numbers of sensors, the size of the conductive areas, and therefore the value of C, must be increased to compensate. For example, a system with three touch sensor pads 118 (with $$\left(\text{with } C_{tot} = \frac{2}{3}C\right)$$

would require conductive areas 114 about 1.5 times (1.425) larger in area than a system with 20 touch sensor pads 118

$$\left(C_{tot} = \frac{19}{20}C\right)$$

to achieve a similar response.

A capacitive sensor assembly 106 with only one touch sensor pad 118 would need to include at least one ground pad 122 for test pattern membrane 112 testing.

A capacitive sensor assembly 106 that uses a different sampling technique to read the touch sensor pads 118—one that does not ground idle touch sensor pads 118—might also require grounded pads 122 to provide a source of ground coupling for the test pattern membrane 112.

Touch sensor pads 118 can also be broken into multiple groups for testing to provide better isolation, including testing touch sensors in pairs. This can make test pattern membrane 112 layout easier in some cases, but it can also make isolating a failure more difficult in small groups of touch sensor pads 118.

When tested in a large group, one defective touch sensor pad 118 will not typically cause other touch sensor pads 118 to fail testing because of the redundant ground coupling from the functional sensors. With only two or a few touch sensor pads 118 in a group, one defective touch sensor pad 118 might reduce the ground coupling for other touch sensor pads 118 enough to cause multiple touch sensor pads 118 to fail testing.

Testing capacitive sensors designed for object detection (cars, indicia on cards, etc.) is easier than testing touch sensors because the object sensor designs already include a source of ground coupling. These sensors usually incorporate either a second pad tied directly to ground or a cluster of sensor pads that take advantage of idle sensors to provide ground coupling.

Testing clustered object sensors is similar to testing touch sensors in that the design for the conductive area 114 on the test pattern membrane connects multiple object sensor pads 120 together. For object sensor pads 120 with one or more dedicated ground pads 122, each ground pad 122 should be tested individually so that failures in the ground connections can be detected.

The test pattern membrane 112 conductive area for testing an object sensor pad 120 is laid out to mimic the approximate size and capacitive response of the conductive object that the object sensor pad 120 is designed to detect. The response level can be tailored by varying the size of the conductive area 114, for example to produce a minimum acceptable response ("go/no-go") or a more typical response.

Touch sensors with multiple elements (pads) arranged linearly or circularly ("sliders" or "wheels") can be tested as multiple independent touch sensors or treated as object sensors and tested as an independent group. If treated as a group, the same limitation applies as for normal touch sensors: a defect in one sensor may cause other sensors in the group to fail testing due to reduced ground coupling for other sensors.

If tested as discrete touch sensors, conductive areas 114 of similar area to other touch sensors in the group would be placed over each sensor element and connected to other touch conductive areas on the test pattern membrane 112.

If tested as a group, a single multi-pad conductive area 124 that covers all sensor elements in the group would be included on the test pattern membrane 112.

Exemplary Embodiment of a Test Fixture

Figure 12:
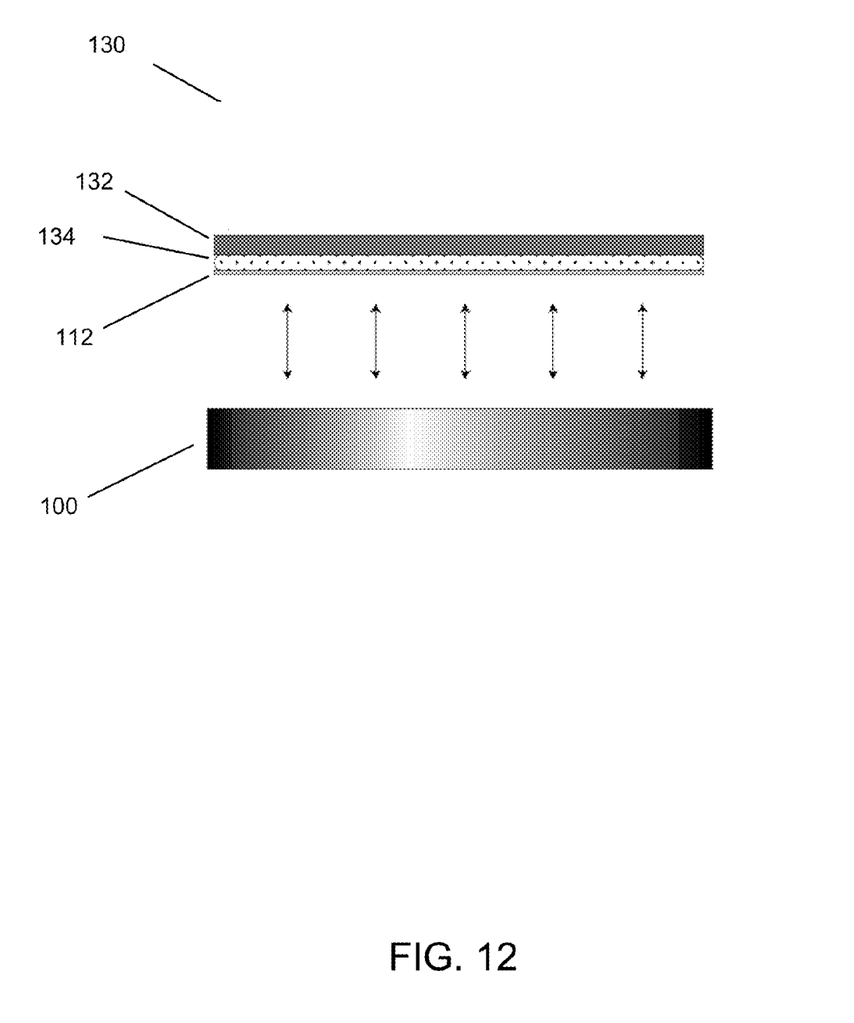
FIG. 12 shows an exemplary embodiment of a test fixture 130 for use with the test pattern membrane test method

FIG. 12 shows an exemplary embodiment of a test fixture 130 for use with the test pattern membrane test method. In the exemplary embodiment, the test pattern membrane 112 is mounted in the test fixture 130 for use in a production environment. The test fixture 130 holds the device-under-test 100 in alignment with the test pattern membrane 112, provides a mechanism for bringing the test pattern membrane 112 into contact with the device-under-test 100, and applies pressure to the test pattern membrane 112 at each conductive area 114 to ensure good capacitive coupling with the pads 118, 120, 122 on the capacitive sensor assembly 106 of the device-under-test 100.

There are a variety of arrangements for the test fixture 130. The test pattern membrane 112 can be mounted to a hinged lid that is closed to bring the test pattern membrane 112 into contact with the device-under-test 100, or a linear actuator, such as a pneumatic slide, could be used to lower the test pattern membrane 112 into place during the test. The basic features of any test fixture may include the following:

A rigid frame for mounting the other components.

A mechanism for holding the device-under-test and aligning it with the test pattern membrane 112.

A mechanism for moving the test pattern membrane 112 assembly into and out of contact with the device-under-test 100.

A rigid mounting plate 132 for mounting the test pattern membrane 112.

A separation layer 134 to electrically insulate the test pattern membrane 112 from the mounting plate 132.

A mechanism for applying pressure to the test pattern membrane 112 at each sensor location.

Aligning the device-under-test with the test pattern membrane 112 is usually straightforward. For many assemblies, a flat surface surrounded by a simple frame that the device-under-test 100 rests in is adequate.

Some types of device-under-test 100 will require more elaborate test fixture 130 if the device-under-test 100 is shaped irregularly or if all sensors are not in a single plane. In some cases, multiple test pattern membrane 112 subassemblies or non-flat test pattern membranes 112 might be required.

Many approaches can be used to apply pressure to the test pattern membrane 112 at each sensor location. Some examples include:

A layer of foam, low-durometer rubber, or other soft material mounted between the test pattern membrane 112 and the mounting plate 132.

Individual pieces of these materials mounted between the test pattern membrane 112 and the mounting plate 132 at each sensor location.

A multipart mounting plate 132 that includes springs and pressure plates at each sensor location to apply pressure.

Pneumatic devices at each sensor location to apply repeatable pressure with regulated air pressure.

Independent weights on slides at each sensor location to provide repeatable pressure.

Combinations of these (like weights on top of rubber or foam pieces).

The test pattern membrane 112 test can also be used for testing a capacitive sensor assembly 106 as a component separately from the rest of the product to which it will ultimately be combined. Factories often receive a capacitive sensor assembly 106—which may include the sensor membrane, artwork, adhesive, and protective coating layers—as a separate part that will be assembled with other parts into a finished product. It is desirable to test the capacitive sensor assembly 106 before the product is assembled, as it is difficult and time consuming to replace a defective capacitive sensor assembly 106 in a finished product.

Component testing uses the same test procedure as for the finished products, but with a test fixture 130 arranged differently. For component testing, the test fixture 130 is designed to hold the sensor assembly, align it with the test pattern membrane 112, and electrically connect the sensor assembly to a printed circuit board 102. The printed circuit board 102 can be either a sample taken from a finished product or a custom printed circuit board with software modified to perform only component testing.

A test pattern membrane 112 can also be useful during the design stages of a product with a capacitive sensor assembly 106. A stand-alone test pattern membrane 112 assembly that can be placed on a development product allows an engineer to quickly test the functionality of the system's sensors. This type of test pattern membrane 112 doesn't necessarily include the test fixture 130 for aligning the product with the test pattern membrane 112 and moving the test pattern membrane 112 into place.

A test pattern membrane 112 assembly like this could also be used for smaller volume production or in a rework environment for testing repaired units before they are returned to the production line for full testing.

Exemplary Test Pattern Membrane Testing Method

During testing of a device-under-test 100 with capacitive sensors 108, test software loaded on the printed circuit board 102 reads values from the capacitive sensors 108 first without the test pattern membrane 112 in place and then with the test pattern membrane 112 placed on the device-under-test. In the exemplary embodiment, the test pattern membrane 112 is designed to stimulate all capacitive sensors 108 simultaneously and the test software is configured to read the capacitive sensors 108 simultaneously in each of the steps in which the capacitive sensors 108 are read, which allows the test software to quickly determine whether the capacitive sensors 108 are working properly or not. However, in other embodiments, the test pattern membrane 112 may not stimulate all capacitive sensors 108 of the device-under-test 100, leaving some capacitive sensors 108 unstimulated. Furthermore, in some embodiments, the software may not have the printed circuit board 102 read all the capacitive sensors 108, and may not simultaneously read all the capacitive sensors 108 that it does read, instead reading the capacitive sensors 108 individually or in groups.

Figure 3:
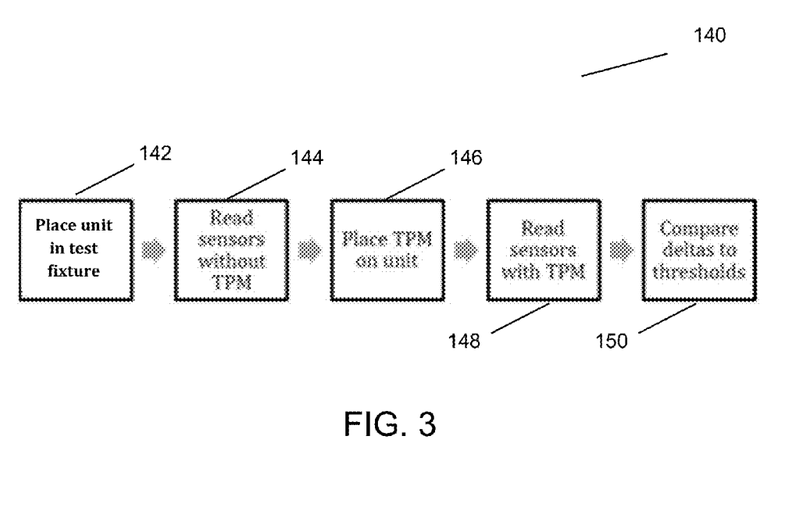
FIG. 3 shows a flow chart of the test pattern membrane testing method.

FIG. 3 shows a flow chart of the test pattern membrane testing method 140. The first step 142 is placing the unit to be tested in the test fixture 130. The unit to be tested may be the entire device-under-test 100 or just the capacitive sensor assembly 106. The second step 144 is reading the capacitive sensors 108 without the test pattern membrane 112 and storing the values as a set of baseline measurements. The third step 146 is placing the test pattern membrane 112 on the unit to be tested. The fourth step 148 is reading the sensors with the test pattern membrane 112 in place to obtain a set of stimulated measurements. The fifth step 150 is comparing the differences (deltas) in the sensor readings with (stimulated) and without (baseline) the test pattern membrane 112 in place. The test software includes a threshold value for each sensor. The test software subtracts the baseline measurement from the stimulated measurement and compares this difference value (the "delta") to the threshold. A sensor is considered to be functioning properly if the difference value is greater than the sensor's threshold value.

Note that in some capacitive sensor measurement techniques, the measured value representing sensor capacitance would decrease instead of increasing, and the difference value would be negative for a properly operating sensor. One such technique measures sensor capacitance by comparing a capacitive sensor to a reference capacitor, counting how many cycles are required to charge the reference capacitor by transferring charge from the capacitive sensor. As sensor capacitance increases, this takes fewer cycles and the measurement value decreases.

We claim:

1. A method for testing a product having a plurality of capacitive sensors arranged in a first pattern using a test pattern membrane, comprising:

placing the product in a test fixture;

reading a first capacitance of the plurality of capacitive sensors without the test pattern membrane on the product;

placing the test pattern membrane on the product, the test pattern membrane having a non-conductive substrate and a plurality of conductive areas on the non-conductive substrate, wherein the plurality of conductive areas are arranged in a second pattern that corresponds to the first pattern of capacitive sensors;

reading a second capacitance of the plurality of capacitive sensors with the test pattern membrane on the product;

determining a difference between the second capacitance and first capacitance for at least one of the plurality of capacitive sensors; and determining if the product is defective based on a comparison of the difference with a threshold.

* * * * *